(12) United States Patent
Ikeda et al.

(10) Patent No.: US 7,419,770 B2
(45) Date of Patent: Sep. 2, 2008

(54) MANUFACTURING METHOD OF OPTICAL DEVICE PROVIDED WITH RESIN THIN FILM HAVING MICRO-ASPERITY PATTERN

(75) Inventors: Masaaki Ikeda, Kyoto (JP); Shigeru Aoyama, Kyoto (JP)

(73) Assignee: OMRON Corporation, Kyoto (JP)

( * ) Notice: Subject to any disclaimer, the term of this patent is extended or adjusted under 35 U.S.C. 154(b) by 766 days.

(21) Appl. No.: 10/930,728

(22) Filed: Aug. 31, 2004

(65) Prior Publication Data

US 2005/0079331 A1  Apr. 14, 2005

(30) Foreign Application Priority Data

Sep. 1, 2003  (JP) .............................. 2003-309111

(51) Int. Cl.
*G02B 5/08* (2006.01)
(52) U.S. Cl. .................. 430/321; 264/1.1; 427/162; 427/355
(58) Field of Classification Search .................. None
See application file for complete search history.

(56) References Cited

U.S. PATENT DOCUMENTS 6,759,182 B2  7/2004  Ikeda

2002/0125588 A1 *  9/2002  Ikeda et al. ................ 264/1.6
2003/0086036 A1 *  5/2003  Yang et al. .................. 349/113

FOREIGN PATENT DOCUMENTS

JP  2002-268057 A  9/2002

* cited by examiner

*Primary Examiner*—John A. McPherson
(74) *Attorney, Agent, or Firm*—Osha•Liang LLP

(57) ABSTRACT

A manufacturing method of an optical device having a micro-asperity pattern that has various kinds of accurate three-dimensional shapes and is realized as thin films includes: a first step of coating a substrate with a resin thin film made of a photosensitive resin; a second step of forming a material-property-changed part at a part of the resin thin film by photolithography; a third step of controlling a temperature of the resin thin film to be a temperature that is lower than a photosensitivity extinction temperature or a hardening reaction starting temperature of the resin thin film; a fourth step of pressing a die having a micro-asperity pattern against the surface of the resin thin film to form a first micro-asperity pattern in a state in which the resin thin film has been softened or melted; and a fifth step of forming a second micro-asperity pattern at a part of the resin thin film by removing the material-property-changed part.

4 Claims, 18 Drawing Sheets

Fig. 5
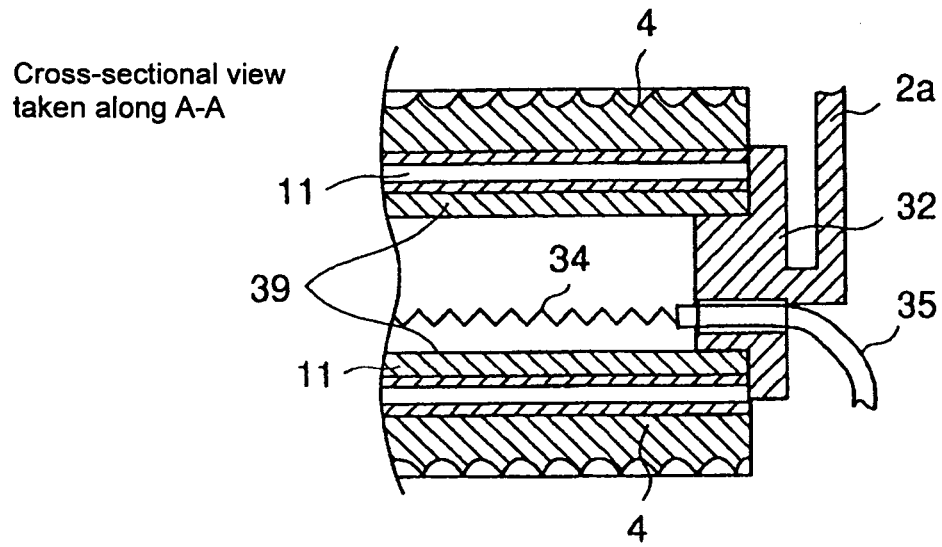
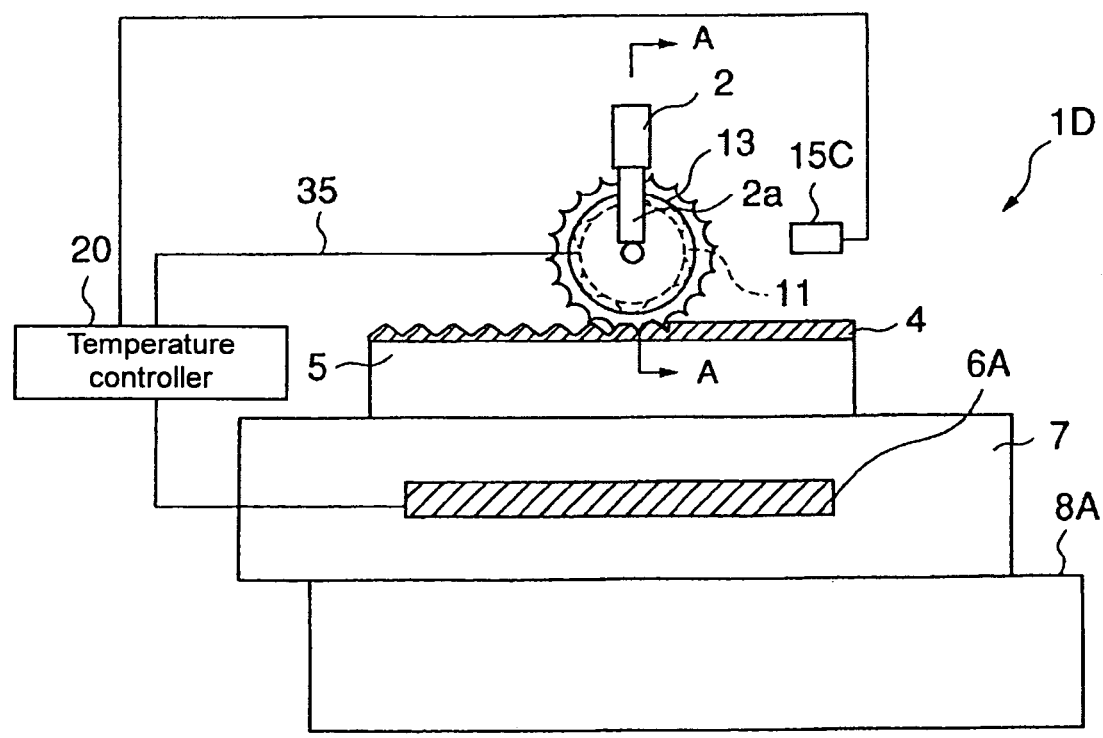

MANUFACTURING METHOD OF OPTICAL DEVICE PROVIDED WITH RESIN THIN FILM HAVING MICRO-ASPERITY PATTERN

BACKGROUND OF INVENTION

1. Field of the Invention

The present invention relates to a manufacturing method of an optical device provided with a resin thin film having a micro-asperity pattern.

2. Background Art

In this specification, "optical device" is a device which has at least a micro-asperity pattern on its surface and diffuses, condenses and reflects light, "micro-asperity pattern" is a generic term of asperity shapes that develop one-dimensionally or two-dimensionally and are 0.1 μm to hundreds of micrometers in depth and arbitrary in width, length and shape. In addition, "electronic device" is a generic term of electronic circuit constitutions for displaying pixels comprising pixel driving elements such as thin film transistors (TFTs), metal wiring contacts or the like.

Recently, as a liquid crystal display such as a personal computer, a TV, a word processor, a video equipment or the like, reflection-type liquid crystal display that displays a liquid crystal image by reflecting external light instead of using a backlight has been developed in order to increase the functionality and reduce the size, power consumption, cost or the like.

As shown in FIG. 17, a reflection plate 1 which is used in the above reflection-type liquid crystal display is used to increase the viewing angle of the image display of the liquid crystal display by diffuse-reflecting light coming from a counter substrate 28 with a micro-asperity pattern.

As shown in FIG. 18, the reflection plate is provided with an electronic device such as a thin film transistor or a wiring contact 31 under a resin thin film 4, and a contact hole 37 is formed for penetrating the resin thin film 4 for providing electric connection.

As a manufacturing method of such reflection plate, there is disclosed a method in which a photosensitive resin material applied by spin coating or the like onto a surface of a substrate made of glass or a resin is softened or melted, a micro-asperity pattern is formed by pressing a die having the desired micro-asperity pattern, and the asperity patterned shape is processed by photolithography to form a through-hole which penetrates the photosensitive material.

According to the conventional method, since a temperature when the micro-asperity pattern is formed is controlled so as to be lower than a photosensitivity extinction temperature of the photosensitive resin material, a contact hole can be formed by photolithography. However, in this conventional method, when ultraviolet rays and the like are applied with a mask in photolithography, since the rays are diffused in the photosensitive resin material because of the micro-asperity pattern formed on the surface of the photosensitive material, there are problems such that 1) an exposed region is blurred and processing precision is lowered and 2) an exposed amount becomes uneven and a development defect is generated.

SUMMARY OF INVENTION

The present invention was made in view of the above problems and it is an object of the present invention to provide a manufacturing method of an optical device having a micro-asperity pattern, which can form various kinds of three-dimensional shapes with satisfactory processing accuracy.

According to an embodiment of the present invention, a manufacturing method of an optical device having a micro-asperity pattern comprises: a first step of coating a substrate with a resin thin film made of a photosensitive resin; a second step of forming a material-property-changed part at a part of the resin thin film by photolithography; a third step of controlling a temperature of the resin thin film to be a temperature that is lower than a photosensitivity extinction temperature or a hardening reaction starting temperature of the resin thin film; a fourth step of pressing a die having a micro-asperity pattern against the surface of the resin thin film to form a first micro-asperity pattern thereon in a state in which the resin thin film has been softened or melted; and a fifth step of forming a second micro-asperity pattern at a part of the resin thin film by removing the material-property-changed part.

According to the manufacturing method of the present invention, since the material-property-changed part is formed by photolithography before the first micro-asperity pattern is pressed against the thin film of the photosensitive resin formed on the substrate, the irradiated rays are not diffused by the micro-asperity pattern when the material-property-changed part is formed. Therefore, the exposed region is not blurred and the exposed amount can be uniform. Thus, since processing precision is not lowered and a development defect is not generated, there can be provided an optical device with high processing precision.

In addition, since the temperature of the thin film of the photosensitive resin is controlled so as to be lower than the photosensitivity extinction temperature or the hardening reaction starting temperature, the material-property-changed part is protected and there can be selectively formed the second micro-asperity pattern such as the through-hole with high precision.

BRIEF DESCRIPTION OF DRAWINGS

FIG. 5 shows a main part of a micro-asperity pattern forming apparatus according to a fourth embodiment of the present invention.

DETAILED DESCRIPTION

Preferred embodiments of the present invention will be hereinafter described in detail with reference to the accompanying drawings. The dimensions, materials, shapes, relative arrangements and the like of components used in the embodiments are just examples and are not intended to restrict the scope of the invention unless there is a specific statement to the contrary.

[Embodiment 1]

Figure 1:
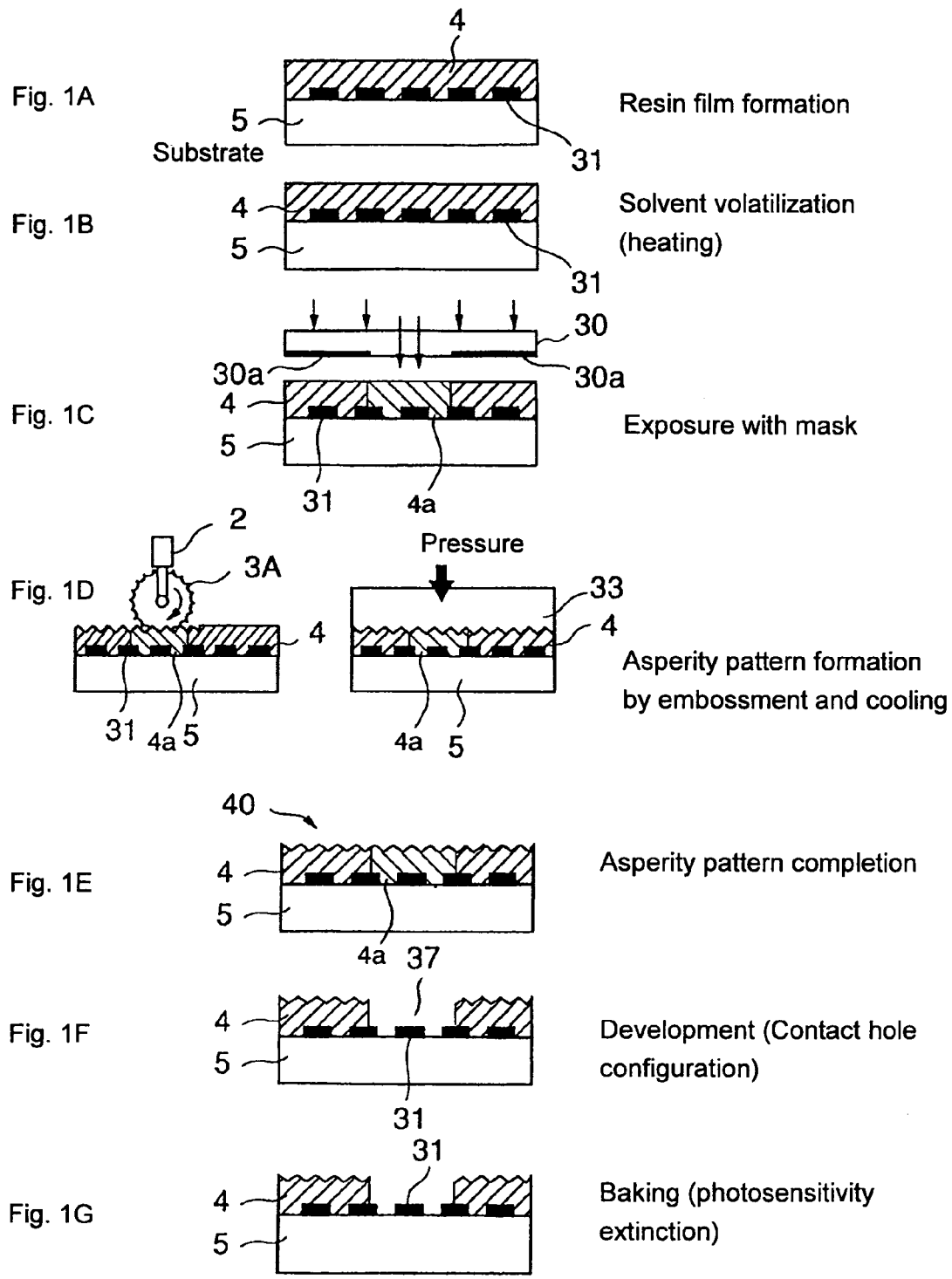
FIG. 1 shows a micro-asperity pattern forming method according to embodiments of the present invention.

FIG. 1 shows a manufacturing method of an optical device according to an embodiment of the present invention. As shown in FIG. 1A, a resin thin film 4 is formed of a photosensitive resin such as an acrylic resin by spin coating on a glass substrate 5 on which an electronic device 31 such as liquid-crystal driving element TFTs or a wiring contact 31 or the like and then as shown in FIG. 1B, unnecessary solvent is volatized by heating the resin thin film 4. Then, as shown in FIG. 1C, unnecessary parts of a transmission material 30 is covered with a mask 30a and irradiated with ultraviolet rays to form a material-property-changed part 4a in which properties of the material is changed. In this state, the glass substrate 5 is heated by a hot plate while it is controlled such that the resin thin film 4 and the material-property-changed part 4a are kept at a temperature lower than either a photosensitivity extinction temperature or a hardening reaction starting temperature. Then, as shown in FIG. 1D, when the softened or molten resin thin film 4 is pressed by a stamper 33 or an embossment roll 3A, a micro-asperity pattern 40 which is a reversed pattern of the stamper is transferred on a surface of the resin thin film 4 as shown in FIG. 1E.

Then, as shown in FIG. 1F, the material-property-changed part 4a is exposed and developed by an alkaline solution or an organic solvent. Then, as shown in FIG. 1G, when the glass substrate 5 is heated up to a temperature higher than the hardening reaction starting temperature of the resin thin film 4 and baked by an oven, the photosensitivity of the resin thin film is lost and the resin thin film is hardened, so that generation of gas associated with volatilization of the solvent or decomposition of the photosensitive component is lowered and film quality of the micro-asperity pattern 40 is stabilized.

Although the baking temperature may be set at a temperature higher than the hardening reaction starting temperature, in order to prevent the optical device and the device on which the optical device is mounted from deteriorating by gas generation or a hardening reaction of unhardened component in case they are heated up at a higher temperature, the above temperature is preferably set at highest in the heating process until a practically used stage of the optical device manufactured by a manufacturing method according to the present invention.

In addition, since alignment film mainly formed of a polyimide resin is baked after the micro-asperity pattern of the resin thin film is formed in a process for manufacturing a liquid crystal device, a temperature is preferably set at 200° C. or more to prevent gas generation accompanied by volatilization of the remaining solvent from the resin thin film and decomposition of the remaining photosensitive component. In addition, a glass-transition temperature of the photosensitive resin after baking is preferably at least at 200 □C in order to prevent the configuration of the micro-asperity pattern from deteriorating in the burning process.

As the photosensitive resin, it is preferable to use the acrylic resin, NN777 (product number) produced by JSR Corporation. According to the photosensitive resin, a photosensitivity extinction starting temperature is about 100° C. and the hardening reaction starting temperature is 120 to 140° C. and a solvent volatilization temperature and the heating temperature during embossment is 90° C. After the embossment and photolithography are performed, the sintering at about 200° C. is performed in order to induce a polymerization reaction and stabilize the resin thin film. In addition, since the photosensitive resin is a negative type of photosensitive resin in which the material-property-changed part 4a is hardened by exposure and becomes stable as a material, the pattern is provided when the part to be removed is covered with the mask (30a) and developed with the alkaline developer or the organic solvent. Meanwhile, as shown in FIG. 1, in a case of a positive type of photosensitive resin which becomes unstable as a material because the material-property-changed part 4a is decomposed by exposure, a part not to be removed is covered with the mask (30a) and developed.

According to this embodiment, after the photosensitive resin thin film 4 is coated on the surface of the substrate 5, it is heated at the solvent volatilization temperature of 90° C. which is higher than a room temperature (30° C.) to volatize the solvent and a through-hole is covered with the mask (30a) and the part other than the through-hole is changed in quality of the material by ultraviolet rays to be stabilized as the material. Then, while it is heated up to 90° C. again, it is pressed by the stamper to form the micro-asperity pattern and then cooled down to the room temperature, whereby the micro-asperity pattern is completed. Then, the through-hole which is a mask region is removed with the alkaline developer and baked at 200° C.

Figure 18:
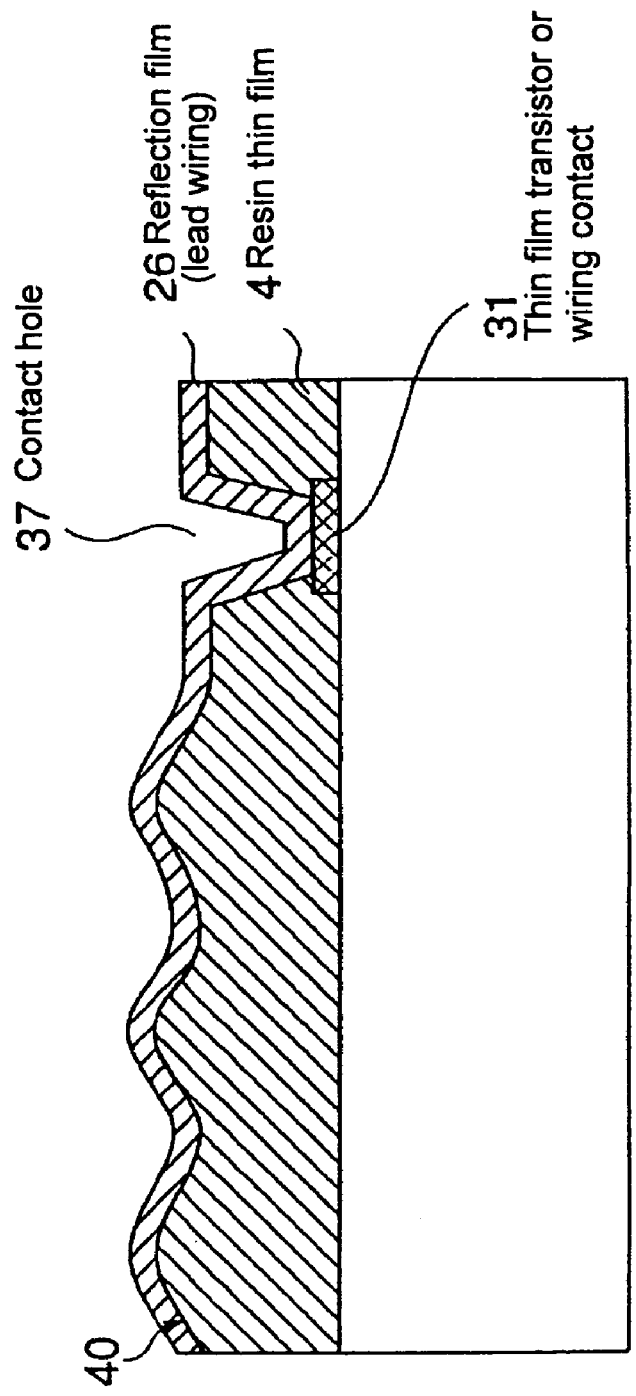
FIG. 18 shows a conducting passage between a conductor part of a reflection plate asperity pattern and a conductor part of a substrate.

Then, as shown in FIG. 18, a metal thin film formed of Ag or Al or the like is deposited on the pattern 40 of the resin thin film 4 by sputtering to form a reflection film 26, whereby a reflection plate 1 is completed.

Figure 2:
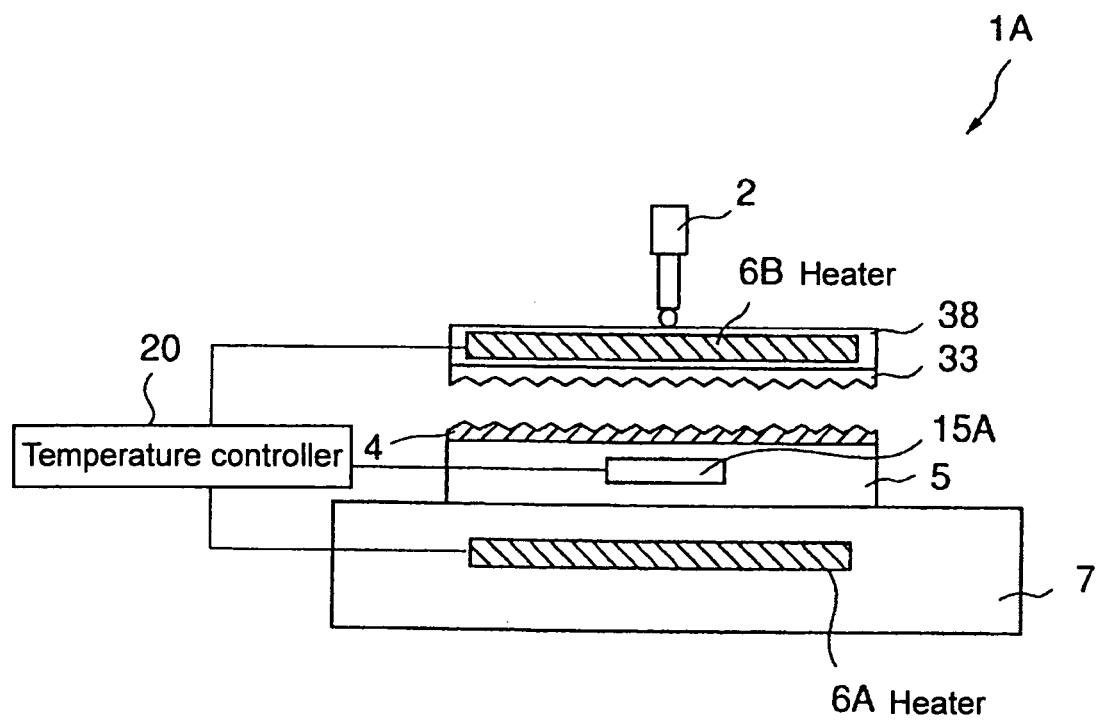
FIG. 2 shows a main part of a micro-asperity pattern forming apparatus according to a first embodiment of the present invention.

FIG. 2 shows a main part of a micro-asperity pattern forming apparatus 1A according to a first embodiment of the present invention. Referring to FIG. 2, both surfaces of an opaque or transparent substrate 5 which is formed of ceramics, glass, plastics, aluminum, molybdenum, silicon or the like is polished and have predetermined undulation, warping and flatness. According to the warping, if its curvature is within several centimeters, it is allowable. That is, in a case of the substrate of 550×650 mm, it is to be within 400 µm. In addition, a curvature of the undulation is set within 4 µm and a curvature of the flatness is set so as to be less than tens of nanometers.

A resin thin film 4 formed of an acrylic resin (PMMA), an epoxy-acrylic resin, polyimide (PI), polyamide-imide (PAI), polyetherimide (PEI) or the like is formed on the substrate 5 by spin coating to be about 0.1 µm to 100 µm in thickness. A stamper 33 provided above the resin thin film is formed of a metal material such as Ni, SUS or Cu, ceramics, glass, silicon, resin or the like. According to the stamper 33, its surface may be directly patterned by carving, etching, printing or the like.

The stamper 33 is fixed to a base 38, and a heater 6B is provided inside the base 38 so as to be able to heat almost all region in which the micro-asperity pattern is formed. In addition, a plurality of temperature sensors 15A are provided around the substrate 5 and control a temperature using an average value of the temperatures at the positions of the respective temperature sensors 15A. Besides, the resin used in the resin thin film 4 is not limited to the above resins. For example, a novolak resin, a phenolic resin or the like may be used.

The stamper 33 which presses the resin thin film 4 is held by a pressuring mechanism 2 and pressure of several Mpa to several thousands of Mpa is applied by the pressuring mechanism 2. The pressuring mechanism 2 may use a hydraulic mechanism, or it may use a pneumatic mechanism, reactive force of a highly elastic spring, restorative force of a shape memory metal or the like.

The substrate 5 may be mounted on a transfer stage 7 by vacuum adsorption, or it may be firmly fixed by another holding device such as electrostatic adsorption. A heater 6A is provided inside the transfer stage 7 so as to be able to heat almost the entire region of the substrate 5. The heaters 6A and 6B are controlled to be at a predetermined temperature by a temperature controller 20 based on temperature information of the temperature sensors 15A provided around the substrate 5.

According to the first embodiment, the micro-asperity pattern 40 is formed on the resin thin film 4 by firmly fixing the substrate 5 on the transfer stage 7, and pressing the asperity pattern of the stamper 33 against the resin thin film 4. In addition, since the temperature of the resin thin film 4 is controlled based on the temperature information of the temperature sensors provided around the substrate 5, there is provided an optical device and a reflection plate having an accurate micro-asperity pattern.

[Embodiment 2]

Figure 3:
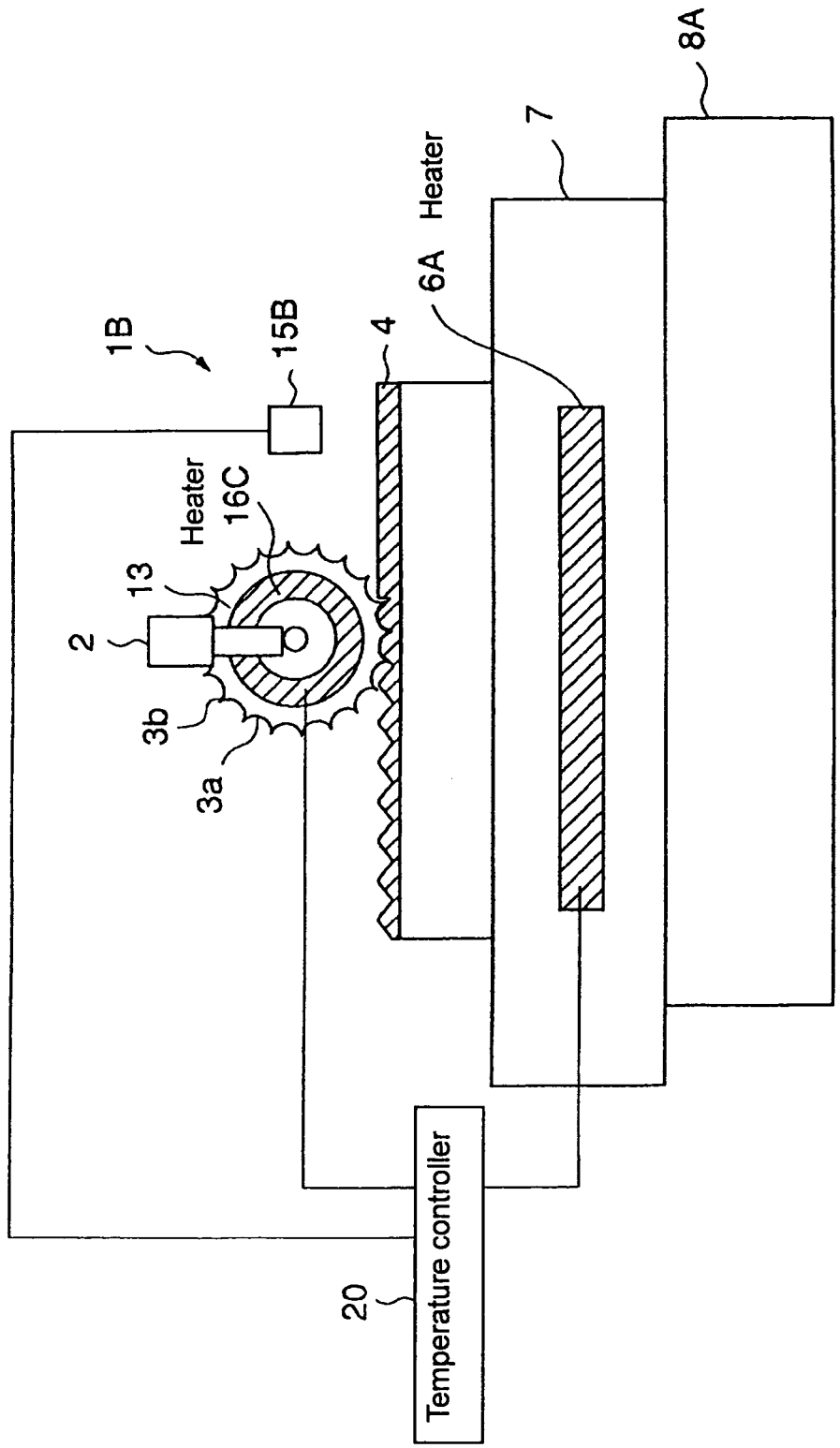
FIG. 3 shows a main part of a micro-asperity pattern forming apparatus according to a second embodiment of the present invention.

FIG. 3 shows a main part of a micro-asperity pattern forming apparatus 1B according to a second embodiment of the present invention. This embodiment is different from the first embodiment in that an embossment roll 13 has a cylindrical configuration, a heater 16C is provided inside the embossment roll 13, the heater 16C and a heater 6A provided inside a transfer stage 7 can be controlled by a temperature controller 20 and a resin thin film 4 is heated while the resin thin film 4 is pressed by the embossment roll 13.

According to the second embodiment, the heater 16C is provided inside the embossment roll 13 so as to be able to heat the embossment roll 13 from the inside, and the heater 6A is provided inside the transfer stage 7. These heaters are controlled by the temperature controller 20 based on a detection temperature by a temperature sensor 15B. The heaters may be a heating wire heater, a high-power lamp, a ceramic heater or the like. Theses heaters control the resin thin film 4 such that a heat distribution thereof becomes uniform.

In addition, a heat-insulating material for insulating the transfer stage 7, the embossment roll 13, a pressuring mechanism 2 and a moving mechanism 8A from the heaters is used and a cooling mechanism such as a water cooler, an air cooler or the like is also provided, although they are not shown.

According to the second embodiment, since the embossment roll 13 presses the surface of the resin thin film 4, the surface of the resin thin film 4 is pressed by recesses 3a of the embossment roll 13. Thus, even when there are air bubbles in the resin thin film 4, since the air bubbles are pushed and moved in the direction opposite to the moving direction of the resin thin film 4 by the recesses 3a of the embossment roll 13, the resin part is broken by projections 3b of the embossment roll and the air bubbles are leaked, so that the micro-asperity pattern is prevented from being deformed by the air bubbles.

[Embodiment 3]

Figure 4:
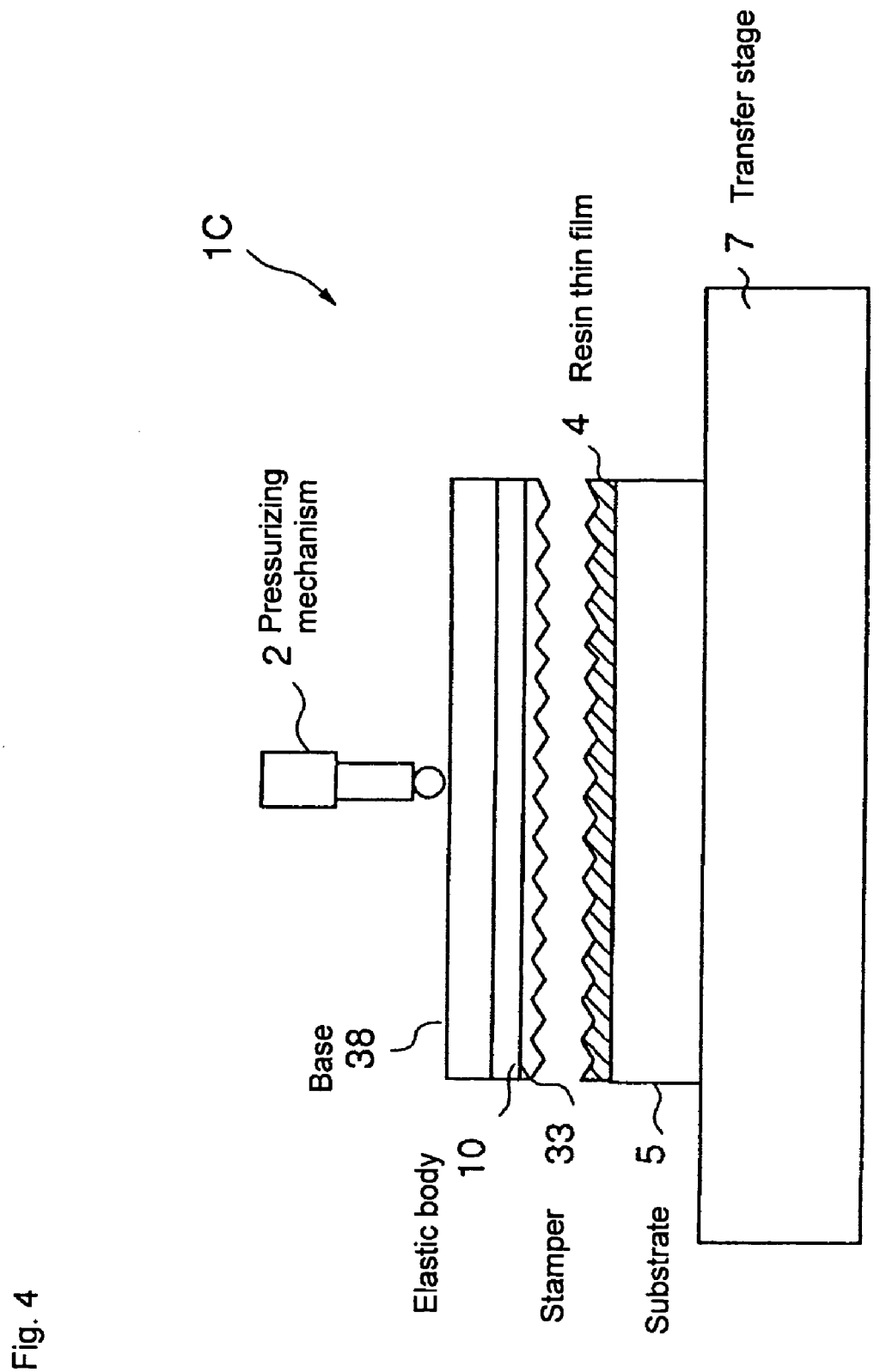
FIG. 4 shows a main part of a micro-asperity pattern forming apparatus according to a third embodiment of the present invention.

FIG. 4 shows a main part of a micro-asperity pattern forming apparatus 1C according to a third embodiment of the present invention. This embodiment is different from the first embodiment shown in FIG. 2 in that an elastic body 10 such as a synthetic rubber, a rectangular metal sheet or a combination of those is interposed between a base 38 and the stamper 33. Thus, even when there is a manufacturing error such as undulation in the base 38 or the stamper 33, since it can be absorbed, an optical device can be manufactured with high precision. In addition, heaters 6A and 6B are not indicated for convenience of explanation.

[Embodiment 4]

FIG. 5 shows a main part of a micro-asperity pattern forming apparatus 1D according to a fourth embodiment of the present invention. This embodiment is different from the second embodiment shown in FIG. 3 in the constitution of an embossment roll. That is, a roll end 32 which engages with a pressuring mechanism 2 is provided, both ends of a cylindrical roll body 39 is held by the roll end 32, a heater 34 is provided inside the roll body 39 through a wiring 35 from a temperature controller 20, and an elastic member comprising a thin plate 11 formed of metal or a resin is interposed between the roll body 39 and an embossment roll 13.

According to such constitution, since the elastic member is provided between the roll body 39 and the embossment roll 13, even when there is a manufacturing error such as undulation in the embossment roll 13 or the roll body 39, since it can be absorbed, so that an optical device can be manufactured with high precision.

[Embodiment 5]

Figure 6:
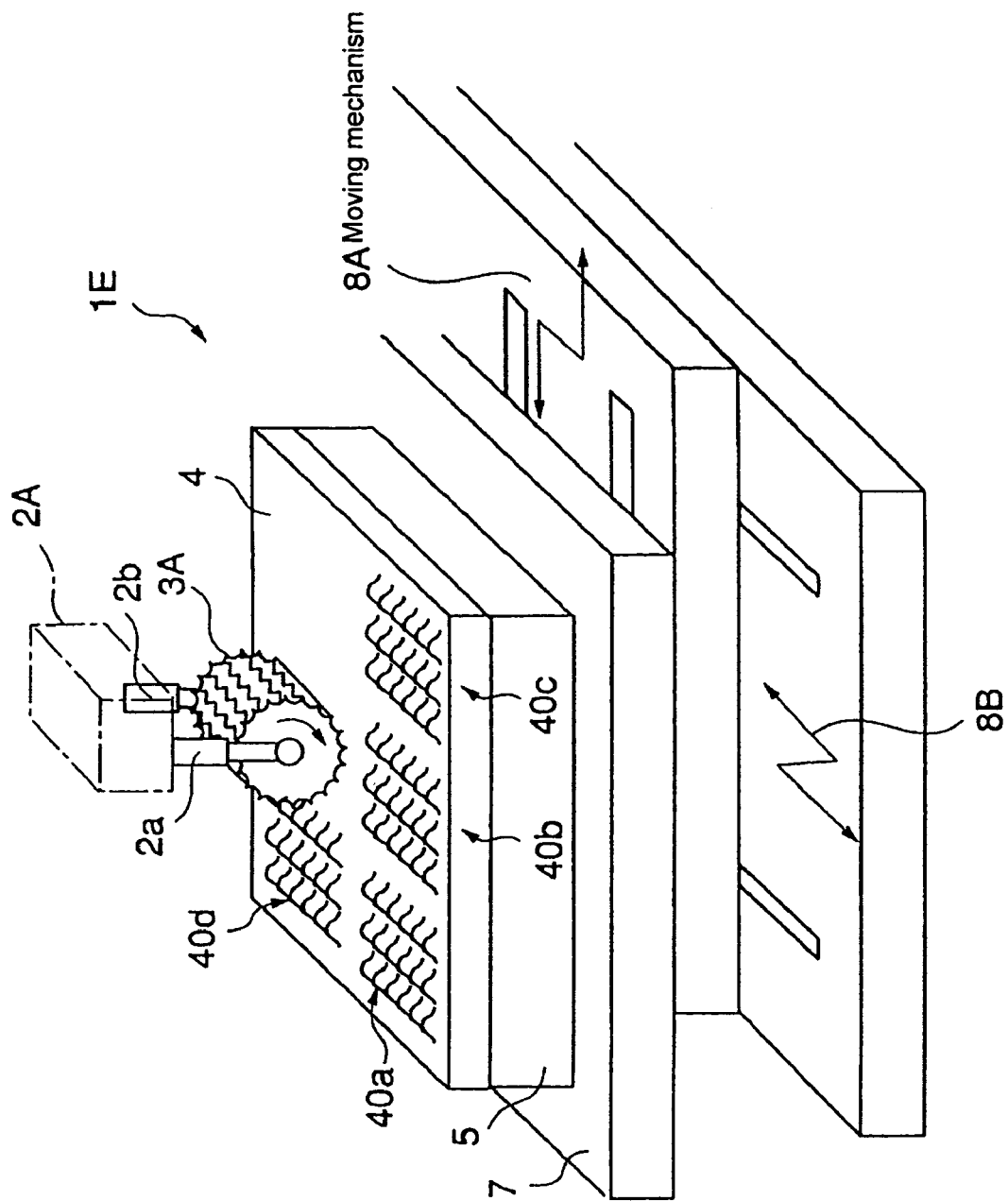
FIG. 6 shows a main part of a micro-asperity pattern forming apparatus according to a fifth embodiment of the present invention.

FIG. 6 shows a main part of a micro-asperity pattern forming apparatus 1E according to a fifth embodiment of the present invention. This embodiment is different from the second embodiment shown in FIG. 3 in that a pressuring mechanism 2A holding an embossment roll 3A with arms 2a and 2b is constituted so as to be able to move vertically while it presses a resin thin film 4, and a moving mechanism 8A is set on an embodiment-roll-rotation-axis-direction moving mechanism 8B so as to be able to move in the embossment roll rotation axis direction. In addition, heaters 6A and 16C are not described for convenience of explanation.

According to this constitution, micro-asperity patterns having desired lengths can be provided at appropriate intervals like 40a, 40b, 40c, and 40d by vertically moving the pressuring mechanism 2A while a transfer stage 7 is moved. Consequently, the asperity patterns can be formed regularly and arbitrarily.

[Embodiment 6]

Figure 7:
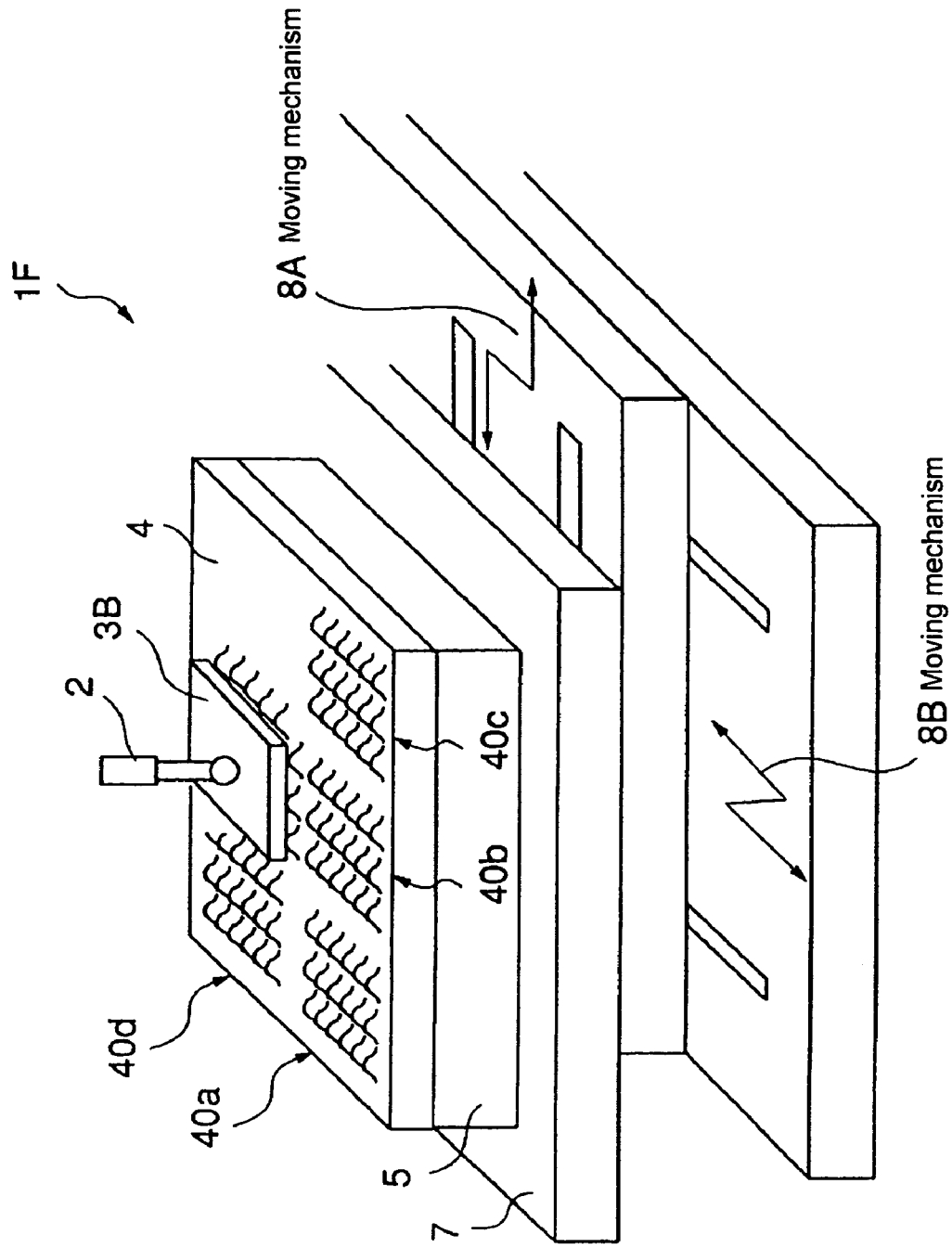
FIG. 7 shows a main part of a micro-asperity pattern forming apparatus according to a sixth embodiment of the present invention.

FIG. 7 shows a main part of a micro-asperity pattern forming apparatus 1F according to a sixth embodiment of the present invention. This embodiment is different from the fourth embodiment shown in FIG. 5 in that it is constituted such that a stamper 3B which presses a resin thin film 4 is held by a pressuring mechanism 2 and pressure of several MPa to several thousands of Mpa is applied by the pressuring mechanism 2. In addition, the pressuring mechanism 2 is constituted so as to be able to move vertically while it presses the resin thin film 4. In addition, heaters 6A and 16C are not described for convenience of explanation.

In this constitution, micro-asperity patterns 40 can be formed by firmly fixing a substrate 5 on a transfer stage 7 and pressing an asperity pattern of the stamper 3B to a surface of the resin thin film 4 by the pressuring mechanism 2. Then, asperity patterns having desired lengths can be provided at appropriate intervals like 40a, 40b, 40c, and 40d by vertically moving the pressuring mechanism 2 while a transfer stage 7 is moved. Consequently, the asperity pattern can be formed regularly and arbitrarily.

[Embodiment 7]

Figure 8:
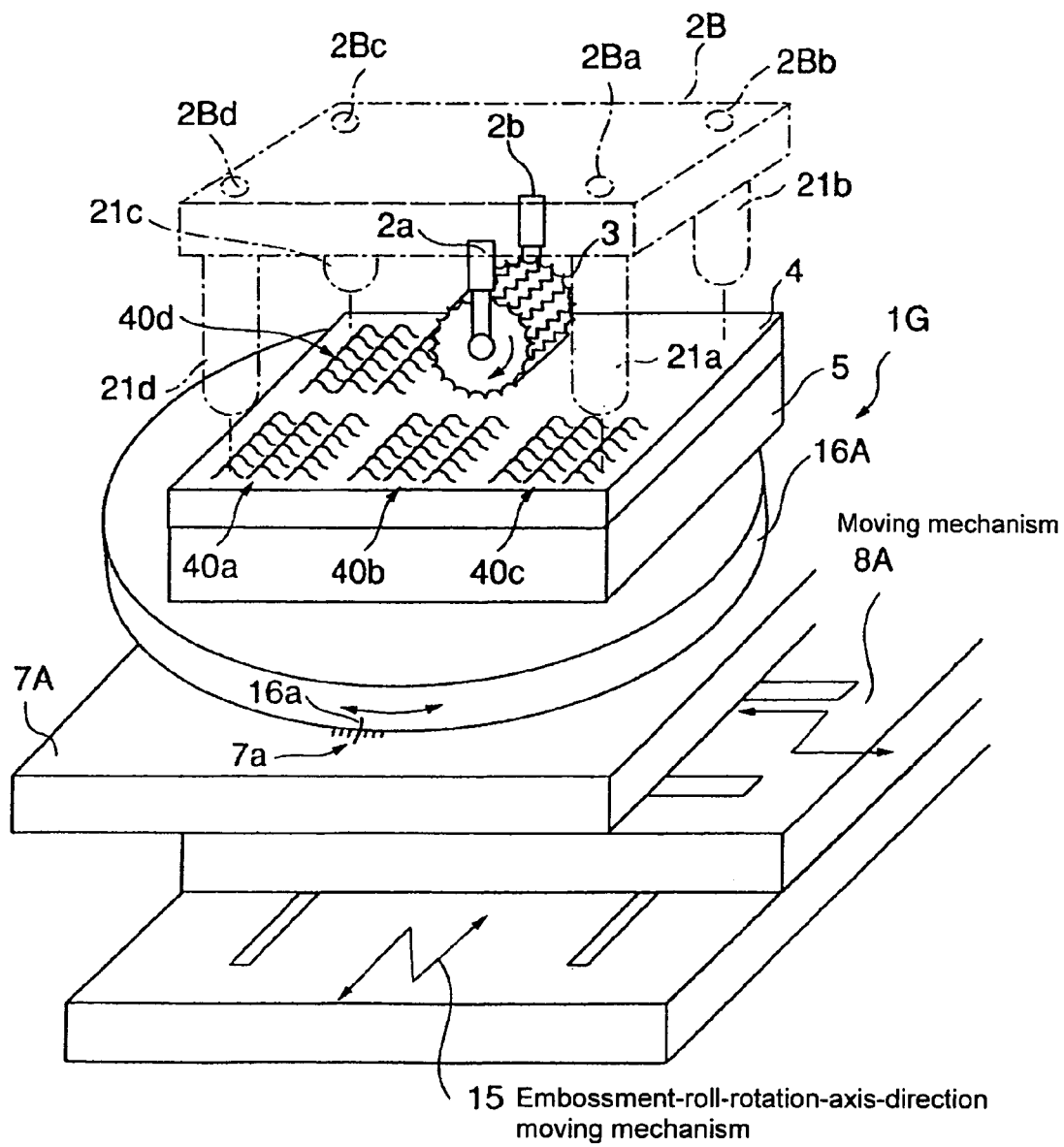
FIG. 8 shows a main part of a micro-asperity pattern forming apparatus according to a seventh embodiment of the present invention.

FIG. 8 shows a main part of a micro-asperity pattern forming apparatus IG according to a seventh embodiment of the present invention. This embodiment is different from the fifth embodiment shown in FIG. 6 in that a substrate rotation direction adjustment mechanism 16A is provided between a transfer stage 7 and a substrate 5 and a pressuring mechanism 2B is provided that has alignment mark observation optical devices 21a to 21d which can read alignment marks on the substrate 5 or on a resin thin film 4.

Thus, the substrate 5 may be attached to the substrate rotation direction adjustment mechanism 16A by vacuum adsorption, or it may be firmly fixed thereon by another holding device such as electrostatic adsorption. The substrate rotation direction adjustment mechanism 16A is rotatably held by the transfer stage 7A, and a manipulation lever is provided at a position not shown in FIG. 8. Thus, by operating the manipulation lever, the mechanism 16A is fixed on the transfer stage 7A or the mechanism 16A is unfixed from the transfer stage 7A so as to be rotatable.

In addition, a fine adjustment dial is provided at a position not shown in FIG. 8. Thus, by operating the fine adjustment dial, the substrate rotation direction adjustment mechanism 16A can be rotated, and the amount of rotation of the substrate 5 can be adjusted by using an index 16a provided on the mechanism 16A and movement distance marks 7a provided on the transfer stage 7. In addition, although the substrate rotation direction adjustment mechanism 16A is provided between the transfer stage 7A and the substrate 5 in this embodiment, the position of the mechanism 16A is not limited to that position. For example, it may be provided under the embossment-rotation-axis-direction moving mechanism 15.

In addition, illumination light sources are provided at positions corresponding to the respective alignment mark observation optical devices 21a to 21d in the substrate rotation direction adjustment mechanism 16A. Meanwhile, there are provided observation windows 2Ba to 2Bd for observing the alignment marks provided on a front surface of the substrate 5 under the resin thin film 4, by the alignment mark observation optical devices 21a to 21d.

A description will be made of the alignment marks with reference to FIG. 9. Referring to an example of a color liquid crystal display, alignment marks 5a and 5b or 22 are provided so as to bring a color filter layer (not shown) into line with liquid crystal driving elements 31 formed on the substrate 5 in position.

Figure 9A:
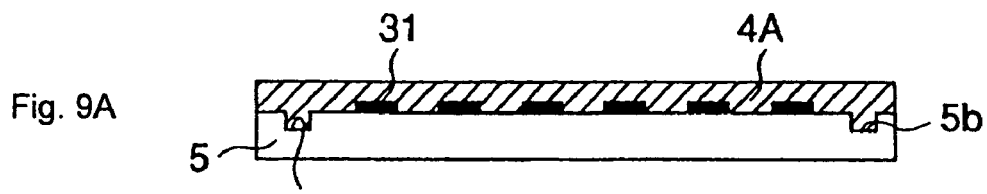
FIG. 9 shows a main part of a micro-asperity pattern forming apparatus in the case where a substrate having alignment marks used for liquid crystal driving elements under a reflection plate is used.

In a case shown in FIG. 9A, after recesses 5a and 5b for the alignment marks are provided in the substrate 5, liquid crystal drive devices 31 such as TFTs are formed by repeating steps in which a metal film is formed on the surface of the substrate 5 by sputtering, a resist is applied thereon by spin coating, the resist is baked at a high temperature and hardened, the resist is exposed with ultraviolet rays through a proper mask, the exposed resist is removed with a developer, it is baked at a high temperature again, a film which is not covered is removed by etching, and the remaining resist is removed by a remover. Then, a resin thin film 4A is formed on the surface of the substrate 5 by spin coating. Thus, the recesses 5a and 5b are filled with the resin thin film 4A.

Figure 9B:
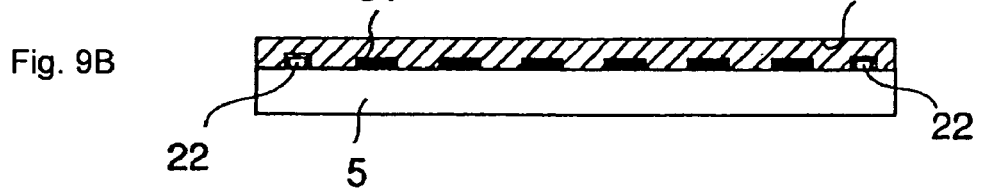

In addition, according to a case shown in FIG. 9B, after the alignment marks 22 are formed together with the liquid crystal driving elements 31 such as TFTs are formed on the surface of the substrate 5 by the above method, a resin thin film 4B is formed on the surface of the substrate 5 by spin coating.

Figure 9C:
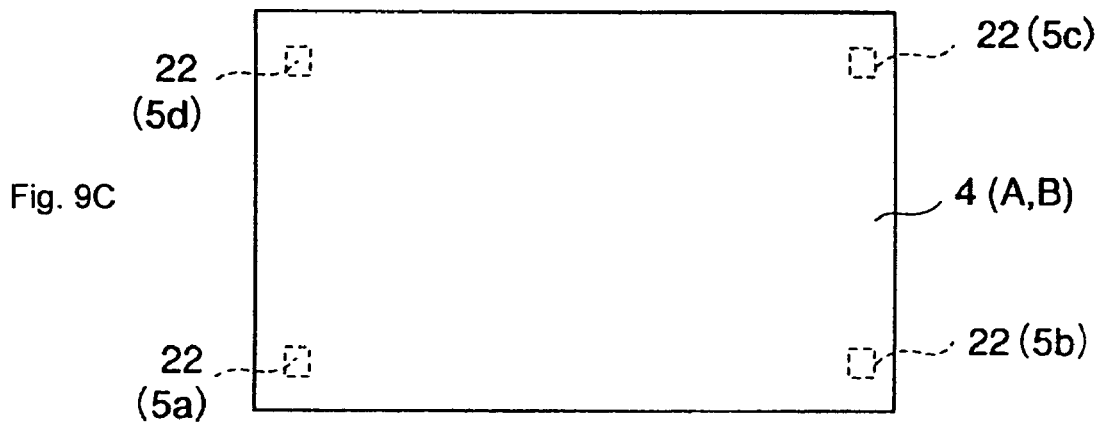
Figure 9D:
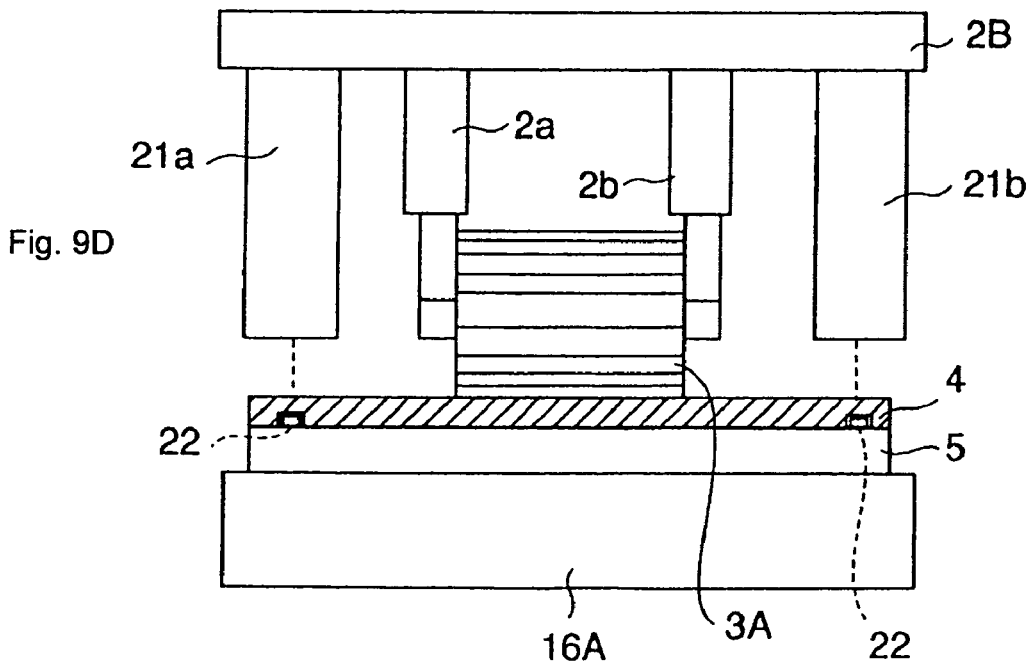

Thus, as shown in FIG. 9C, the alignment marks 22 or 5a to 5d are arranged at the four corners of the resin thin film 4 (A and B). It is preferable that the alignment marks have a shape whose center can be easily recognized, such as cross, square, circle, or the like. FIG. 9D schematically shows the members located between the substrate rotation direction adjustment mechanism 16A and the pressurizing mechanism 2B as viewed from the right side in FIG. 8.

Next, the operation of the above apparatus according to the seventh embodiment will be described with reference to FIG. 8. Projection images of the alignment marks produced by the alignment mark observation devices 21a to 21d are observed through the observation windows 2Ba to 2Bd. If positions of the alignment marks 5a to 5d that are formed on the substrate 5 deviates from reference positions of the alignment mark observation devices 21a to 21d, movement adjustments are performed by the embossment-roll-rotation-axis-direction moving mechanism 15 and/or the substrate rotation direction adjustment mechanism 16A, whereby the deviations from the reference positions are made to be within a prescribed reference value.

Then, the transfer stage 7 is moved to a right-hand initial position. At the initial position, the pressurizing mechanism 2B is lowered to a prescribed position and the transfer stage 7 is moved leftward while the pressurizing mechanism 2B applies prescribed pressure to the resin thin film 4, whereby micro-asperity patterns 40a, 40b and 40c are formed.

After the first leftward movement of the transfer stage 7, the pressurizing mechanism 2B is elevated to the initial position. The moving mechanism 8A is moved to the viewer's side in FIG. 8 by a prescribed distance by the embossment-roll-rotation-axis-direction moving mechanism 15, and the transfer stage 7 is returned to the right-hand initial position. The pressurizing mechanism 2B is again lowered to the prescribed position and the transfer stage 7 is moved leftward while the pressurizing mechanism 2B applies the prescribed pressure to the resin thin film 4, whereby micro-asperity patterns 40d or later are formed.

In this embodiment, the four alignment mark observation optical devices 21a to 21d are used. Alternatively, one or two alignment mark observation optical devices 21 may be used. In this case, position deviations of the alignment marks are determined by driving the embossment-roll-rotation-axis-direction moving mechanism 15 or the moving mechanism 8A and the deviations from the reference positions are made to be within the prescribed reference value by driving the substrate rotation direction adjustment mechanism 16A. Although in this embodiment, the alignment marks are projected to the observation windows, they may be displayed on a monitor screen by using a CCD camera or the like.

The alignment marks may be formed by directly processing the substrate 5 itself by wet etching, dry etching, sand blasting, embossment, or the like. Alternatively, a thin film of metal, an insulator, a resin, or the like may be formed on the surface of the substrate 5 by sputtering, spin coating, evaporation, CVD, or the like and then processed by wet etching, dry etching, sand blasting, embossment, or the like.

In this embodiment, the alignment marks are formed on the surface of the substrate 5. Another configuration is possible in which alignment mark positions are formed, together with the asperity pattern, on the embossment roll 3 at positions distant from alignment marks of the embossment roll 3 and additional alignment marks corresponding to the alignment marks 5a and 5b or 22 are formed on the surface of the resin thin film 4 and observed with the alignment mark observation optical devices 21a to 21d.

Figure 10:
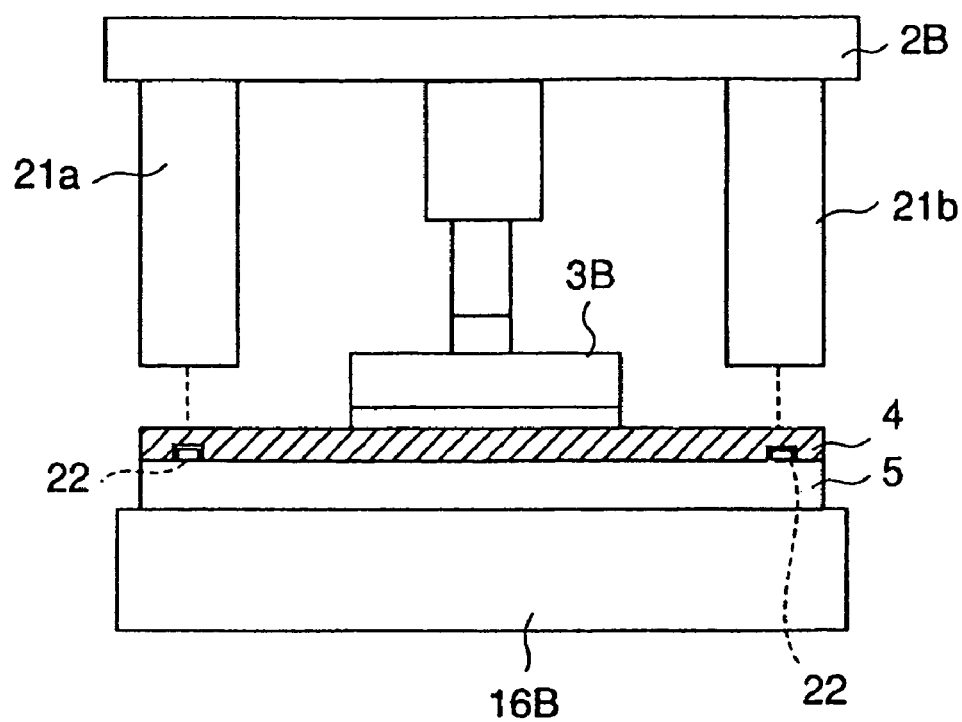
FIG. 10 shows a main part of a micro-asperity pattern forming apparatus in the case where a substrate having alignment marks used for liquid crystal driving elements under a reflection plate is used.

FIG. 10 shows a micro-asperity pattern forming apparatus according to another embodiment in which the embossment roll 3A is replaced by the stamper 3B used in the apparatus of FIG. 7. The other part of the configuration of the apparatus of FIG. 10 is the same as of the apparatus of FIG. 7. Projection images of the alignment marks produced by the alignment mark observation devices 21a to 21d are observed through the observation windows 2Ba to 2Bd. If positions of the alignment marks 2Ba to 2Bd that are formed on the substrate 5 deviate from reference positions of the alignment mark observation devices 21a to 21d, movement adjustments are performed by the embossment-roll-rotation-axis-direction moving mechanism 15 and/or the substrate rotation direction adjustment mechanism 16B, whereby the deviations from the reference positions are made to be within a prescribed reference value.

Then, the transfer stage 7 is moved to a right-hand initial position. At this initial position, the pressurizing mechanism 2 is lowered to a prescribed position and applies prescribed pressure to the resin thin film 4. Then, the transfer stage 7 is moved leftward. In this manner, micro-asperity patterns 40a, 40b and 40c are formed. After the first leftward movement of the transfer stage 7, the pressurizing mechanism 2 is elevated to the initial position, the moving mechanism 8A is moved to the viewer's side in FIG. 10 by a prescribed distance by the embossment-roll-rotation-axis-direction moving mechanism 15, and the transfer stage 7 is returned to the right-hand initial position. The pressurizing mechanism 2 is again lowered to the prescribed position and applies the prescribed pressure to the resin thin film 4, and the transfer stage 7 is moved leftward, to form a micro-asperity patterns 40d or later.

Figure 11:
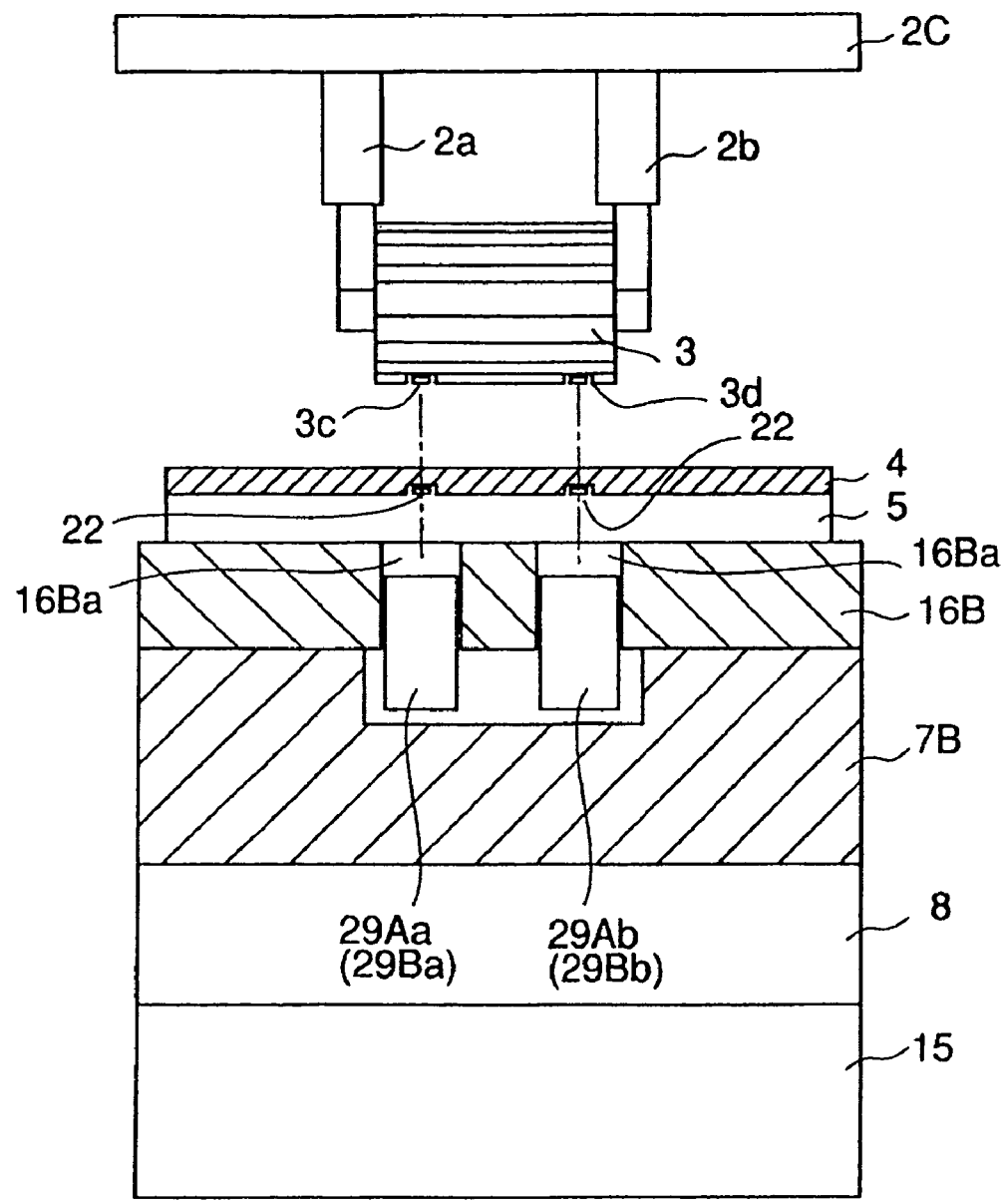
FIG. 11 shows a main part of a micro-asperity pattern forming apparatus having alignment mark observation devices under a reflection plate.
Figure 12A:
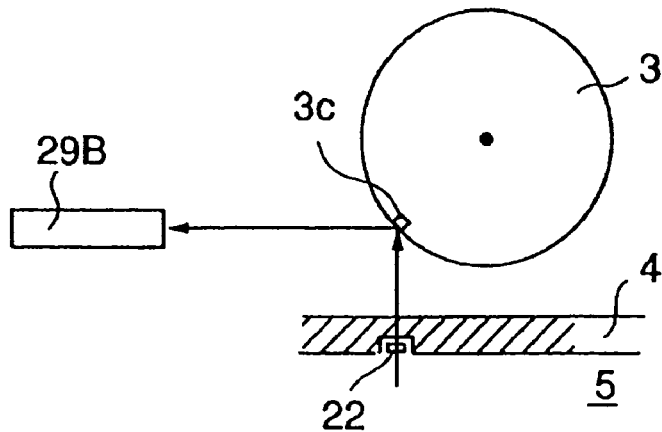
FIG. 12 shows an observation method of the alignment mark observation device.
Figure 12B:
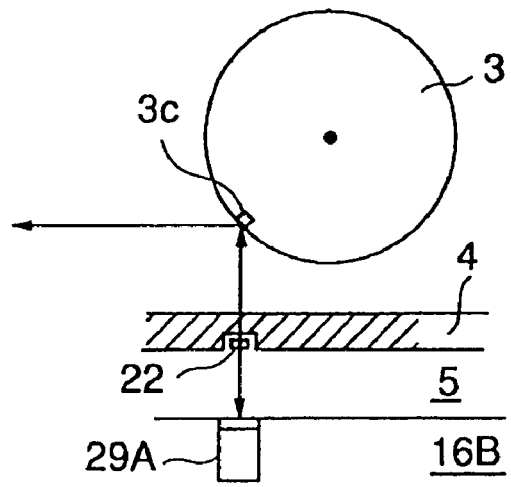
Figure 12C:
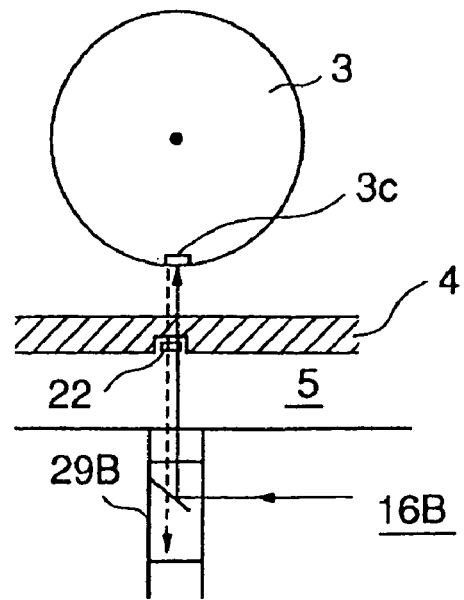

Next, a micro-asperity pattern forming apparatus according to another embodiment having alignment mark observation devices under a reflection plate will be described with reference to FIG. 11. This is different from FIG. 8 in that whereas the apparatus in FIG. 8 has the pressurizing mechanism 2B, the substrate rotation direction adjustment mechanism 16A, and the transfer stage 7A, the apparatus of FIG. 11 uses a pressurizing mechanism 2C, a substrate rotation direction adjustment mechanism 16B, and a transfer stage 7B. An embossment roll 3 that is held by the pressurizing mechanism 2C rotatably is provided with alignment marks 3c and 3d on the outer circumferential surface that is formed with a micro-asperity pattern. A substrate 5 is held by the substrate rotation direction adjustment mechanism 16B. Through-holes 16Ba are formed in the substrate rotation direction adjustment mechanism 16B, and alignment mark observation optical devices 29Aa and 29Ab are provided in and held by the respective through-holes 16Ba. Photodetecting device are placed in the respective alignment mark observation optical devices 29Aa and 29Ab and connected to a monitor via a computer (not shown).

Where the alignment mark observation optical devices 29Aa and 29Ab have fields of view that are wider than an adjustment range, they may be held by the transfer stage 7B. Another configuration is possible in which an alignment mark observation optical device 29B is positioned so as to be able to view the alignment mark 3c provided on the outer circumferential surface of the embossment roll 3 as shown in FIG. 12A and the alignment mark observation optical device 29B detects light that comes via the alignment mark 22 on the substrate side. Still another configuration is possible in which an alignment mark observation optical device 29A is disposed under the substrate 5 as shown in FIG. 11 and detects light coming via the alignment mark 3c from outside the resin thin film 4 as shown in FIG. 12B. Yet another configuration is possible in which, as shown in FIG. 12C, the alignment mark 3c reflects light coming from an alignment mark observation device 29B via the alignment mark 22 that is located right over the alignment mark observation device 29B and then alignment mark observation device 29B detects resulting reflection light.

Next, the operation of the above-configured micro-asperity pattern forming apparatus according to this embodiment will be described. Projection images of the alignment marks 22 produced by the alignment mark observation devices 29Aa and 29Ab are observed with the above-mentioned monitor. If positions of the alignment marks 22 that are formed on the substrate 5 deviate from reference positions of the alignment mark observation devices 29Aa and 29Ab, movement adjustments are performed by the embossment-roll-rotation-axis-direction moving mechanism 15 and/or the substrate rotation direction adjustment mechanism 16B, whereby the deviations from the reference positions are made to be within a prescribed reference value.

Then, the transfer stage 7B is moved to an initial position. At the initial position, the pressurizing mechanism 2 is lowered to a prescribed position and the transfer stage 7B is moved while the pressurizing mechanism 2 applies prescribed pressure to the resin thin film 4. An asperity pattern is formed as the embossment roll 3 rolls.

In this embodiment, the two alignment mark observation optical devices 29Aa and 29Ab are used. Alternatively, one or four alignment mark observation optical devices may be used. In this case, position deviations of the alignment marks are determined by driving the embossment-roll-rotation-axis-direction moving mechanism 15 or the moving mechanism 8 and the deviations from the reference positions are made to be within the prescribed reference value by driving the substrate rotation direction adjustment mechanism 16B.

Figure 13A:
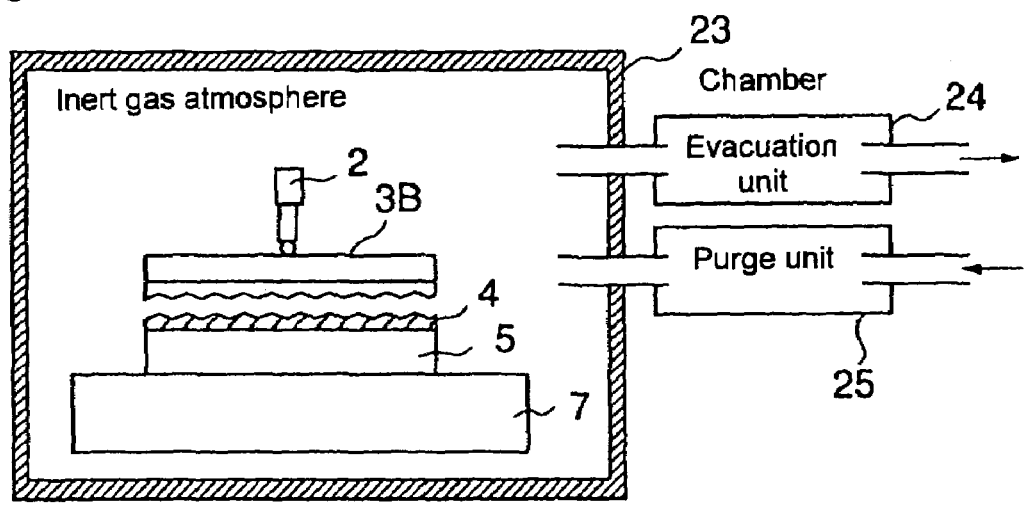
FIG. 13 shows a main part of a micro-asperity pattern forming apparatus provided in an inert gas atmosphere.
Figure 13B:
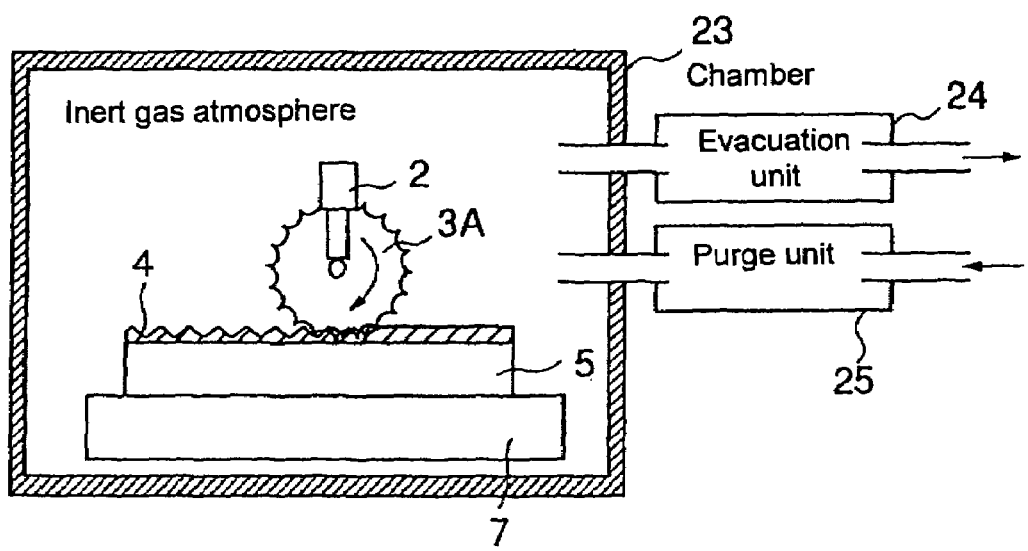

FIG. 13 shows a main part of a micro-asperity pattern forming apparatus in an inert gas atmosphere. As shown in FIG. 13, a transfer stage 7 is provided in an airtight chamber 23 and a substrate 5 that is coated with a resin thin film 4 is held by the transfer stage 7 in a detachable manner. A pressurizing mechanism 2 is provided above the resin thin film 4 so as to be movable in the vertical direction and the right-left direction. A stamper 3B (FIG. 13A) or an embossment roll 3A (FIG. 13B) is attached to the pressurizing mechanism 2 rotatably.

An evacuation unit 24 is connected to the chamber 23 to permit gas to escape from the chamber 23. Since the evacuation unit 24 is provided with a ventilation fan, a rotary pump, or the like, it can expel the gas from the chamber 23 to some extent. A purge unit 25 is also connected to the chamber 23 to supply a prescribed gas to the chamber 23. As a mechanism for supplying inert gas such as $N_2$, Ars, or the like to the chamber 23, a device for controlling the gas flow rate such as a mass flow controller or an APC valve is provided in the purge unit 25. The purge unit 25 is connected to a gas cylinder or a gas refining device as an inert bas supply source (not shown).

According to the above-configured apparatus according to this embodiment, the substrate 5 that is coated with the resin thin film 4 by spin coating is fixed to the transfer stage 7. Then, the evacuation unit 24 is caused to start operating, whereby the air is exhausted from the chamber 23. After the operation of the evacuation unit 24 is stopped, the purge unit 25 is caused to start operating, whereby inert gas is introduced into the chamber 23. Then, the pressurizing mechanism 2 is moved rightward from a left-hand initial position in the chamber 23, whereby an asperity pattern is formed on the resin thin film 4.

According to these embodiments, the air is exhausted from the chamber 23 in advance by the evacuation unit 24. Therefore, oxygen and impurities contained in the air inside the chamber 23 are exhausted and a micro-asperity pattern can be formed in a clean, inert gas atmosphere. This makes it possible to not only prevent the resin thin film 4 from being oxidized or changed in quality, but also prevent a phenomenon that impurities stick to the resin thin film 4 during formation of a micro-asperity pattern, and thus they are finally fixed to the micro-asperity pattern formed, whereby the production yield of an optical device can be increased.

Although in the embodiments, the pressurizing mechanism 2 is made movable in the right-left direction, it goes without saying that the transfer stage 7 may be moved by the moving mechanism 8 and the substrate rotation direction adjustment mechanism 16 may be used.

Figure 14A:
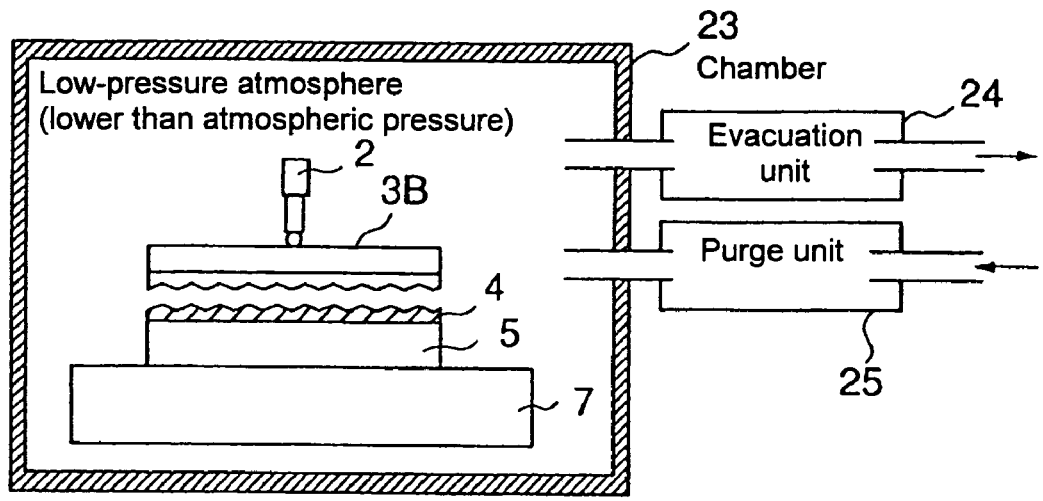
FIG. 14 shows a main part of a micro-asperity pattern forming apparatus provided in a low-pressure atmosphere.
Figure 14B:
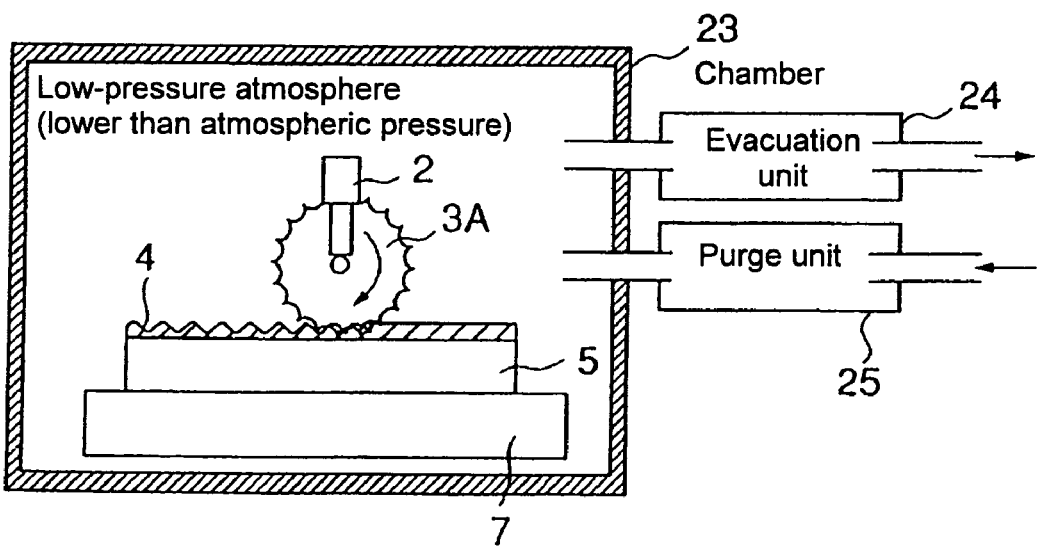

FIG. 14 shows a main part of micro-asperity pattern forming apparatus in a low-pressure atmosphere. This is different from FIG. 13 in that an optical device is manufactured in a low-pressure (lower than atmospheric pressure) atmosphere rather than in an inert gas atmosphere.

The evacuation unit 24 that is connected to the chamber 23 is provided with a rotary pump, a turbo pump, a diffusion pump, or the like so as to be able to exhaust gas from the chamber 23 to establish a pressure of $10^{-3}$ to $10^{-7}$ Torr inside the chamber 23. Inert gas such as $N_2$, Ar or the like may be supplied to the chamber 23 by the purge unit 25. Or an optical device may be manufactured without introducing an inert gas.

According to this embodiment, the air is exhausted from the chamber 23 in advance by the evacuation unit 24. Therefore, oxygen and impurities contained in the air inside the chamber 23 are exhausted and a micro-asperity pattern can be formed in a clean, inert gas atmosphere. Particularly, when the pressure inside the chamber 23 is lowered, water is easily evaporated and exhausted and hence air is no longer trapped between the die and the resin thin film 4. This prevents a phenomenon that impurities, vapor or the like that suspend during formation of a micro-asperity pattern stick to the resin thin film 4, and thus they are finally fixed to the micro-asperity pattern formed. Furthermore, the resin thin film 4 is prevented from being oxidized or changed in quality, and a micro-asperity pattern that is free of air bubbles can be formed. If air bubbles existed, they would act as a damper at the time of pressurization and hence necessitate stronger pressing force. Without air bubbles, the pressing force can be made weaker, which results in decrease of residual stress in a micro-asperity pattern. Therefore, the production yield of an optical device can be increased.

Figure 15:
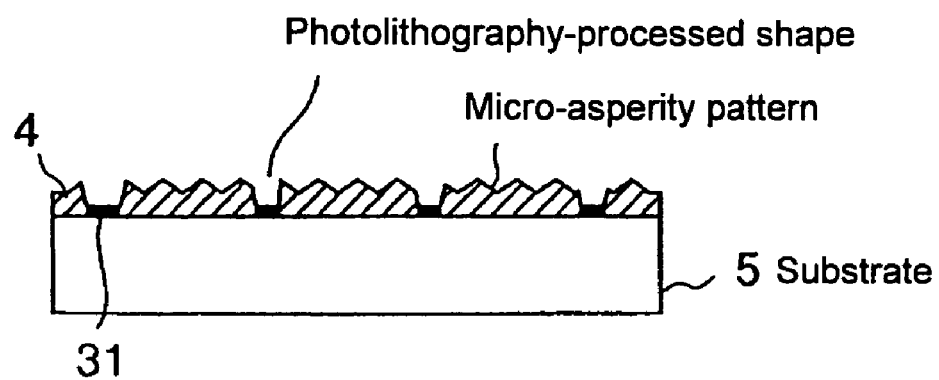
FIG. 15 shows a substrate provided with a resin thin film having an asperity pattern.

Thus, a micro-asperity pattern can be formed on the resin thin film 4 on the substrate 5 as shown in FIG. 15. An optical device that is provided with the resin thin film 4 having the micro-asperity pattern can be used as a transparent diffraction grating substrate, a hologram, an optical storage medium such as an optical disc or the like, a Fresnel lens, a micro-lens array, an optical waveguide or the like by properly selecting an asperity pattern shape, a material of the resin thin film 4, a material of the substrate 5 or the like.

Figure 16:
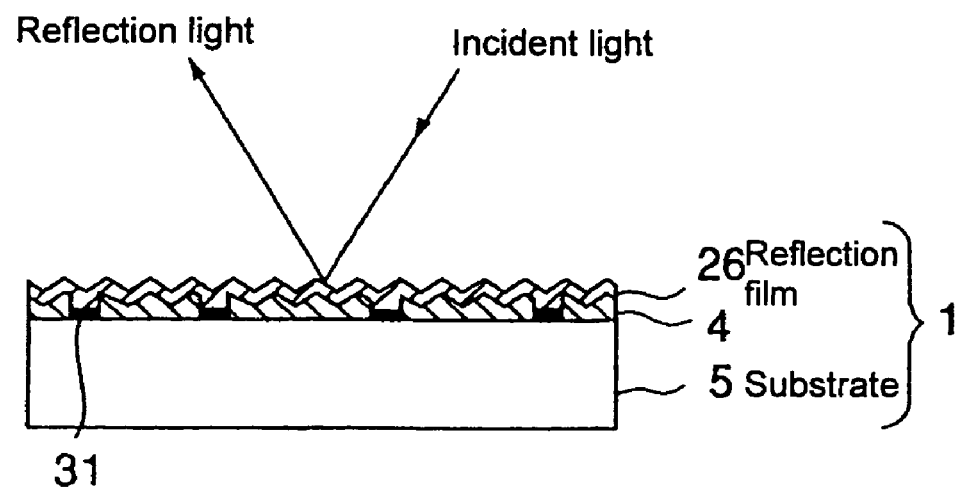
FIG. 16 shows a reflection plate in which an asperity pattern is coated with a reflection film.

A reflection plate shown in FIG. 16 can be manufactured by forming a reflection film 26 by depositing a high reflectivity material such as Al, Ag, and an Al alloy, or an Ag alloy on the micro-asperity pattern surface of the above substrate at a thickness of about 2000 Å by sputtering, evaporation, or the like.

In this case, the adhesiveness between the resin thin film 4 and the reflection film 26 can be increased by laying an intermediate film made of Tr, Cr, Si, or the like between the resin thin film 4 and the reflection film 26, that is, by forming the reflection film 26 after coating the micro-asperity pattern surface with the intermediate film.

The above reflection plate can be used as an optical device such as a hologram, Fresnel mirror, micro-mirror array or the like. The above reflection plate can be used as an electrode substrate of a liquid crystal display of the STN type or the like by forming a metal thin film as the reflection film 26 and planarizing and sealing the metal thin film by spin-coating its surface with an insulating film such as a transparent resin thin film or polyimide, acrylic resin, or the like.

Figure 17:
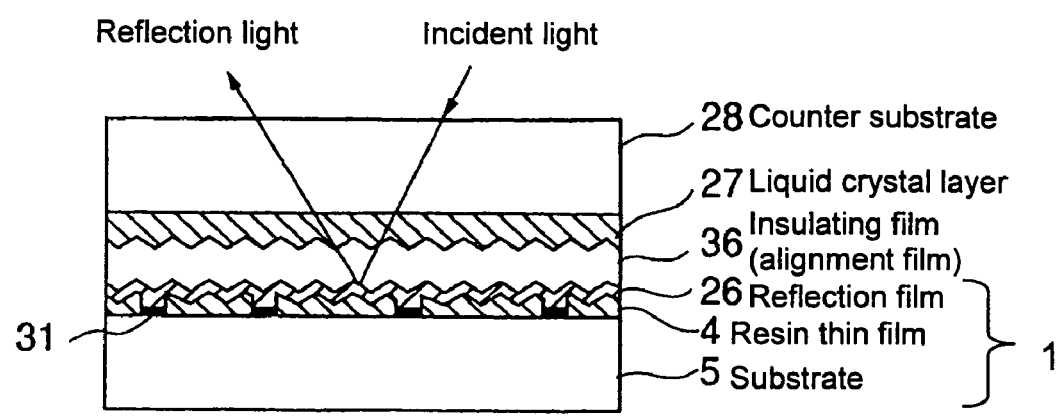
FIG. 17 shows a liquid crystal display according to an embodiment.

FIG. 17 shows a liquid crystal display according to an embodiment of the present invention. A substrate 5 is made of non-alkali glass or a highly heat-resistant resin or the like. Liquid crystal driving elements 31 such as TFTs are formed by a semiconductor fabricating process on the surface of the substrate 5.

The resin thin film 4 is formed by spin-coating a highly heat-resistant material such as a polyimide resin having a glass-transition temperature sufficiently higher than 200 □C. The resin thin film 4 requires a glass-transition temperature similar to or higher than that of the substrate 5 on which the liquid crystal driving elements 31 are formed in order to form the reflection film 26 by depositing a high reflectivity metal such as Al, Ag, and an Al alloy, an Ag alloy, or the like by sputtering evaporation, or the like after the micro-asperity pattern of the resin thin film 4 is formed. The above-mentioned highly heat-resistant material such as a polyimide resin or the like is spin-coated on the reflection film 26 to be used as a transparent insulating alignment film. It is possible to increase light transmissivity by adjusting the thickness of the reflection film 26, and a semi-transmission-type liquid crystal display can be manufactured.

The reflection plate according to this embodiment can be used in not only the reflection-type liquid crystal display but also other reflection-type display. In addition, it can be used in semi-transmission-type liquid crystal display. Although the reflection plate described here is a front-surface-reflection-type reflection plate in which the micro-asperity pattern is formed on the front surface of the reflection plate and incident light is reflected by the surfaces of asperities, the present invention may also be applied to a back-surface-reflection-type reflection plate in which a glass or transparent resin substrate is used and incident light is reflected by a micro-asperity pattern that is formed on the back surface of the substrate.

The reflection-type liquid crystal display having the above-configured reflection plate 1, can be used as a display of electronic equipments such as cellular phones and low-power-consumption-type radio equipments. It goes without saying that the reflection plate can be used in portable information terminals, such as PDAs, portable computers and portable TV receivers.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A manufacturing method of an optical device provided with a resin thin film having a micro-asperity pattern comprising:
    a first step of coating a substrate with a resin thin film made of a photosensitive resin;
    a second step of forming a material-property-changed part at a part of the resin thin film by photolithography;
    a third step of controlling a temperature of the resin thin film to be a temperature that is lower than a photosensitivity extinction temperature or a hardening reaction starting temperature of the resin thin film;
    a fourth step of pressing a die having a micro-asperity pattern against the surface of the resin thin film to form a first micro-asperity pattern in a state in which the resin thin film has been softened or melted; and
    a fifth step of forming a second micro-asperity pattern at a part of the resin thin film by removing the material-property-changed part.

2. The manufacturing method of the optical device according to claim 1, further comprising a sixth step of baking the optical device at a temperature that is higher than the hardening reaction starting temperature of the resin thin film.

3. A manufacturing method of an optical device provided with a resin thin film having a micro-asperity pattern comprising:
    coating a substrate with a resin thin film made of a photosensitive resin;
    forming a material-property-changed part at a part of the resin thin film by photolithography;
    controlling a temperature of the resin thin film to be a temperature that is lower than a photosensitivity extinction temperature or a hardening reaction starting temperature of the resin thin film;
    pressing a die having a micro-asperity pattern against the surface of the resin thin film to form a first micro-asperity pattern in a state in which the resin thin film has been softened or melted after the material-property-changed part is formed at a part of the resin thin film by photolithography; and
    forming a second micro-asperity pattern at a part of the resin thin film by removing the material-property-changed part.

4. The manufacturing method of the optical device according to claim 3, further comprising baking the optical device at a temperature that is higher than the hardening reaction starting temperature of the resin thin film.

* * * * *